(12) United States Patent
Liu et al.

(10) Patent No.: US 7,692,499 B2
(45) Date of Patent: Apr. 6, 2010

(54) DIGITALLY COMPENSATED HIGHLY STABLE HOLDOVER CLOCK GENERATION TECHNIQUES USING ADAPTIVE FILTERING

(75) Inventors: Xin Liu, Shanghai (CN); Liang Zhang, Shanghai (CN); Yong Wang, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 1 day.

(21) Appl. No.: 12/006,368

(22) Filed: Dec. 31, 2007

(65) Prior Publication Data

US 2009/0167443 A1    Jul. 2, 2009

(51) Int. Cl.
H03L 7/093 (2006.01)
H03L 7/087 (2006.01)
H03L 1/00 (2006.01)

(52) U.S. Cl. .............................. 331/17; 331/14; 331/16; 331/158; 331/175; 331/176; 331/11

(58) Field of Classification Search .................... 331/10, 331/11, 14, 16, 17, 18, 66, 116 R, 158, 175, 331/176; 327/156; 342/357.1, 357.12, 357.06
See application file for complete search history.

(56) References Cited

U.S. PATENT DOCUMENTS

| 5,892,408 | A  | * | 4/1999 | Binder ......................... 331/44 |
| 6,711,230 | B1 | * | 3/2004 | Nicholls et al. ............. 375/376 |
| 7,015,762 | B1 | * | 3/2006 | Nicholls et al. ............... 331/10 |
| 2006/0119402 | A1 | * | 6/2006 | Thomsen et al. ........... 327/105 |

* cited by examiner

*Primary Examiner*—Robert Pascal
*Assistant Examiner*—Ryan J. Johnson
(74) *Attorney, Agent, or Firm*—Finnegan, Henderson, et al

(57) ABSTRACT

A system and method for generating a highly stable holdover clock utilizing an integrated circuit and an external OCXO is presented. The integrated circuit comprises an input reference clock receiver, a phase and frequency detector that generates an error signal between the input reference clock signal and a feedback clock signal, a data storage block that stores model parameters to predict frequency variations of the OCXO, an adaptive filtering module that includes a digital loop filter and algorithms for updating the model parameters and predicting frequency variations based on the model, a switch that enables the system to operate in normal or holdover mode, a digitally controlled oscillator, and a feedback divider.

9 Claims, 6 Drawing Sheets

DIGITALLY COMPENSATED HIGHLY STABLE HOLDOVER CLOCK GENERATION TECHNIQUES USING ADAPTIVE FILTERING

BACKGROUND

1. Field of the Invention

The present invention relates to a clock generation circuit in a communication network and, more specifically, to the systems and methods for generating a digitally compensated highly stable holdover clock.

2. Discussion of Related Art

Many communication networks and devices operate using a reference clock backed by a holdover clock. Network clocks are generally traceable to the reference clock. If the reference clock is unavailable, the network clocks should be traceable to the holdover clock. Certain communication networks require highly stable reference and holdover clocks. For example, the current 2G and the future 3G wireless networks have specific stability requirements for the reference clock, ranging from 0.01 ppm to 0.1 ppb. When the reference clock is lost, the stability of the holdover clock becomes crucial to ensuring reliable connections in the network.

Currently, a holdover clock is generally implemented using either a rubidium crystal oscillator ("RbXO") or an oven controlled crystal oscillator ("OCXO") with control voltage inputs. A RbXO can generally meet the strict stability requirements easily, but is very expensive. In comparison, OCXOs are inferior to a RbXO in terms of stability, but are much less expensive. With carefully designed peripheral circuits, it is possible for OCXOs to meet the stability requirements, but at the cost of increased system complexity.

All solutions of holdover clocks based on OCXOs suffer from aging effects of the crystals, which causes the output frequency to drift. As a result, calibration and compensation has to be performed regularly, normally by changing the control voltage of the OCXO. This approach requires the use of a voltage controlled OcxO ("VC-OCXO").

In a typical clock generation circuit, a phase-locked loop with a VC-OCXO is used to generate a holdover clock based on an input reference clock. A phase and frequency detector generates an error signal representing the phase difference between an input reference clock signal and a feedback signal. The error signal is filtered in a filter, and the filtered error signal is then converted to an analog signal, which represents a voltage signal used to control the output signals of the VC-OCXO. The VC-OCXO outputs signals with different frequencies according to the voltage signal. A feedback divider divides the frequency of the VC-OCXO output signal to generate the feedback signal for the phase and frequency detector. One major disadvantage of this approach is that the voltage signal used to control the output clock signal of a VC-OCXO is prone to circuit noise; therefore, accuracy or stability of the output clock signal is often degraded. Furthermore, such clock generation systems are known to be realized only by discrete circuits.

Therefore, it is desirable to develop a solution capable of generating a highly stable holdover clock with both improved accuracy and great cost reduction but without increased system complexity.

SUMMARY

In accordance with some embodiments of the present invention, a system for generating a highly stable output clock signal includes at least an oven controlled crystal oscillator that generates a clock signal; a receiver that generates an input reference clock signal; and a phase and frequency detector that generates an error signal based on the phase difference between the input reference clock signal and a feedback clock signal. The system further includes a data storage block that stores model parameters to predict frequency variations of the clock signal generated by the oven controlled crystal oscillator; an adaptive filtering module which contains a digital loop filter, a first defined algorithm for updating the model parameters stored in the data storage block, a second defined algorithm for predicting frequency variations of the clock signal generated by the oven controlled crystal oscillator based on value of the model parameters stored in the data storage block, and an output selector to generate a data signal. A switch enables the system to operate either in normal mode by connecting the error signal to the adaptive filtering module when the input reference clock signal is available, or in holdover mode by breaking the connection of the error signal to the adaptive filtering module when the input reference clock signal is unavailable. The system also includes a digitally controlled oscillator that operates with the oven controlled crystal oscillator as a reference clock, generates an output clock signal, and adjusts frequency of the output clock signal by adjusting its phase according to the data signal from the adaptive filtering module. Finally, a feedback divider divides the frequency of the output clock signal from the digitally controlled oscillator to generate the feedback clock signal when the system operates in the normal mode.

In accordance with some embodiments of the present invention, a method for generating an output clock signal includes generating an input reference clock signal; when the input reference clock signal is available, generating a feedback clock signal, generating an error signal representing phase difference between the input reference clock signal and the feedback clock signal, generating and locking the frequency of the output clock signal to the frequency of the input reference clock signal based on the error signal, storing two sets of model parameters indicating frequency variations due to aging effects and temperature perturbation of an oven controlled crystal oscillator in a data storage block, updating the two sets of model parameters based on a defined algorithm; when the input reference clock signal is unavailable, generating the output clock signal based on clock signal of the oven controlled crystal oscillator and values of the two sets of model parameters stored in the data storage block.

It is to be understood that both the foregoing general description and the following detailed description are exemplary and explanatory only and are not restrictive of the invention, as claimed. These and further embodiments of the invention are further described below with respect to the following drawings, which are incorporated in and constitute a part of this specification.

In the figures, elements having the same designation have the same or similar function.

DETAILED DESCRIPTION

Figure 1:
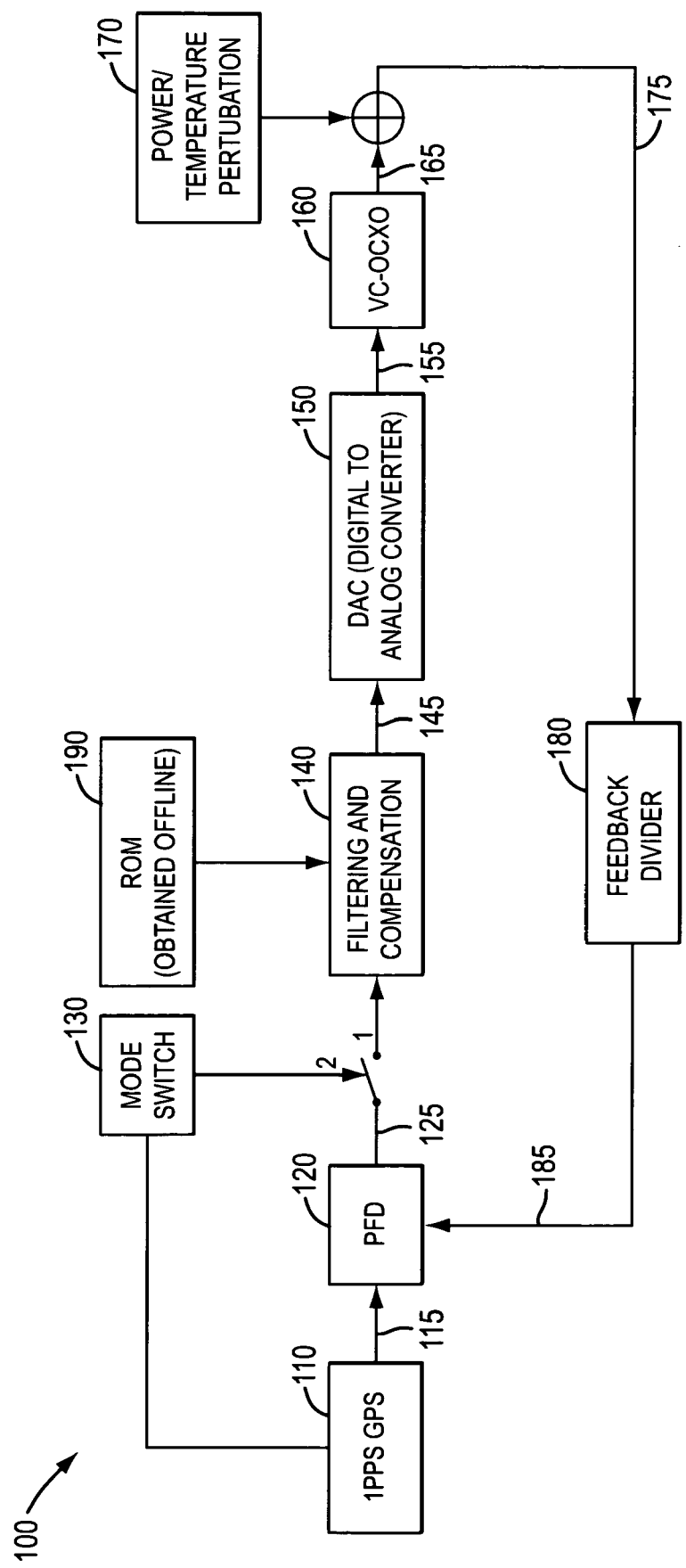
FIG. 1 shows a schematic diagram illustrating a known discrete circuit for generating a holdover clock using a VC-OCXO.

FIG. 1 shows a schematic diagram illustrating a discrete circuit for generating a holdover clock using a VC-OCXO. Circuit 100 includes a Global Positioning System ("GPS") receiver 110, a Phase and Frequency Detector ("PFD") 120, a switch 130, a Filtering and Compensation module ("FC") 140 coupled to a Read Only Memory ("ROM") 190, a Digital to Analog Converter ("DAC") 150, a VC-OCXO 160 with Power/Temperature Perturbation 170, and a Feedback Divider ("FD") 180. GPS receiver 110 receives and generates input reference clock signal 115 from GPS receiver 110. PFD 120 receives input reference clock signal 115 and feedback clock signal 185 and generates error signal 125 representing the phase difference between input reference clock signal 115 and feedback clock signal 185. When switch 130 is in position "1", error signal 125 is connected to FC 140. FC 140 then filters error signal 125 according to filtering parameters stored in ROM 190. Typically, FC 140 filters out jitter in the input 1 PPS signal at GPS receiver 110 to generate digital signal 145. DAC 150 converts digital signal 145 to analog signal 155, which represents a voltage signal used to control output clock signal 165 of VC-OCXO 160. VC-OCXO 160 adjusts the frequency of output clock signal 165 according to analog signal 155. FD 180 divides the frequency of output clock signal 165 to generate feedback clock signal 185.

When switch 130 is in position "2", error signal 125 is disconnected from FC 140, causing FC 140, ROM 190, DAC 150 and VC-OCXO 160 to operate in an open loop. FC 140 then generates a signal 145 based on parameters stored in ROM 190. DAC 150 and VC-OCXO 160 performs the same operations as when switch 130 is in position "1". ROM 190 stores parameters controlling the filtering and compensation performed in FC 140.

Figure 2:
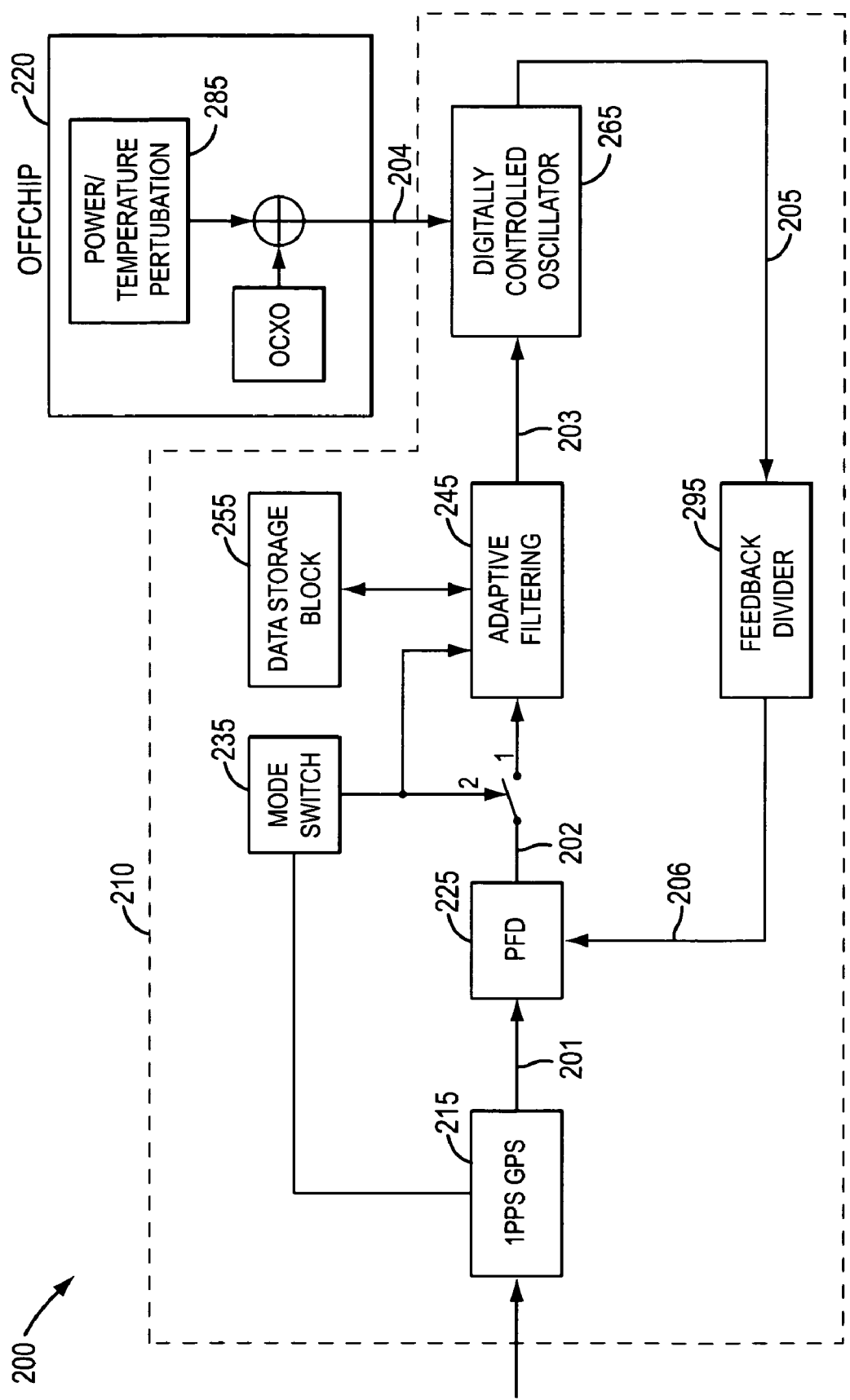
FIG. 2 shows a schematic diagram illustrating a system for generating a holdover clock signal using an OCXO without a voltage control input in accordance with some embodiments of the present invention.

FIG. 2 shows a schematic diagram illustrating a system for generating a highly stable holdover clock using an OCXO without a voltage control input, in accordance with some embodiments of the present invention. System 200 includes integrated circuit 210 and OCXO 220. Integrated circuit 210 includes a GPS receiver 215, a PFD 225, a switch 235, an adaptive filtering ("AF") module 245, a data storage block 255, a digitally controlled oscillator ("DCO") 265, and a FD 295. DCO 265 receives clock signal 204 generated by OCXO 120. GPS receiver 215 receives a reference GPS clock signal and generates an input reference clock signal 201. Data storage block 255 is any memory device for volatile or non-volatile storage of data and programming. In a preferred embodiment of the present invention, data storage block 255 can be realized by an Electrically Erasable Programmable Read-Only Memory (EEPROM), which holds data that allows easy tuning of system performance. In system 210, initially, two separate sets of model parameters of OCXO 220 are stored in data storage block 255 to indicate frequency variations of clock signal 204 due to either temperature perturbation or aging effects of OCXO 220.

Figure 3:
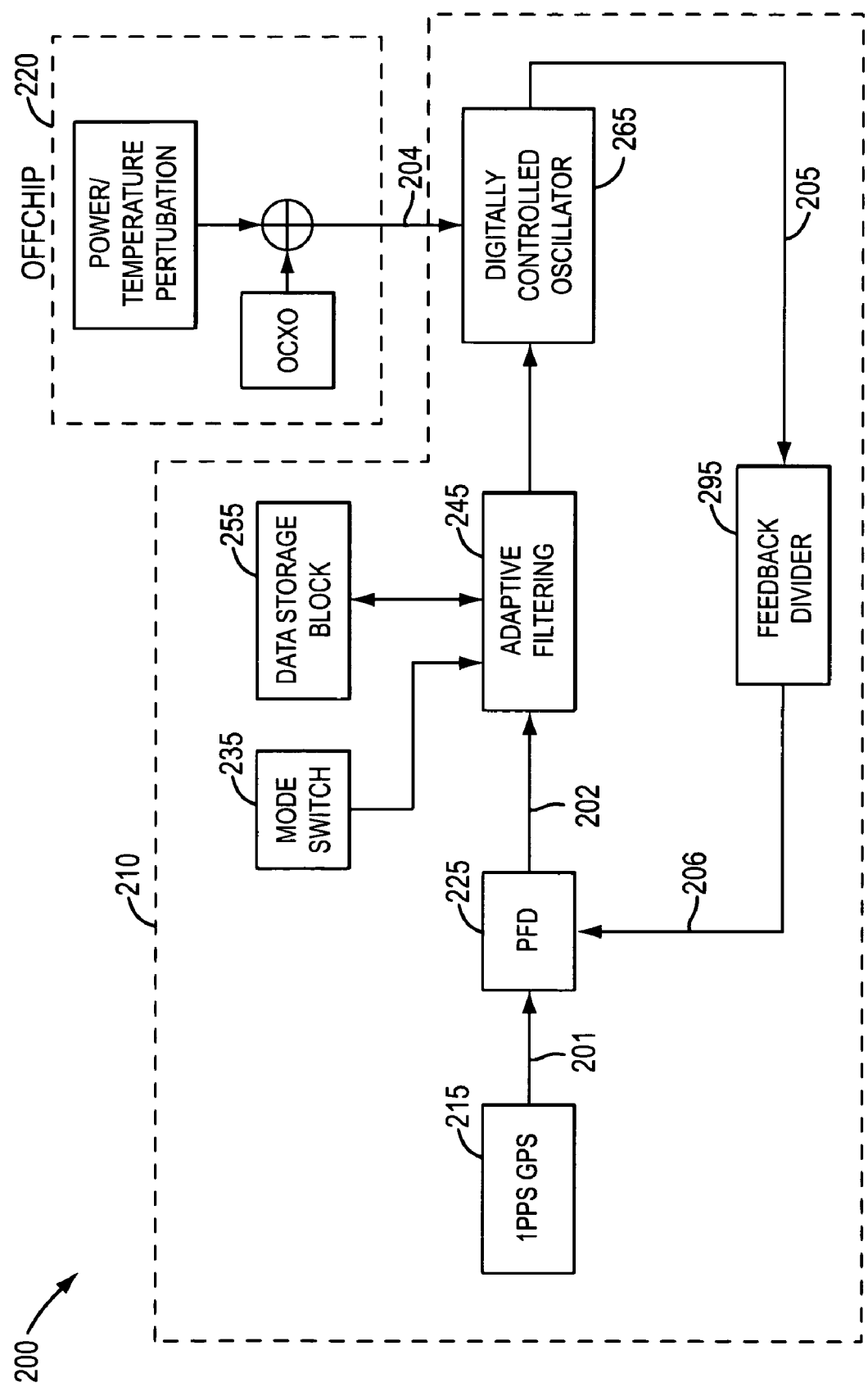
FIG. 3 shows a schematic diagram illustrating operation of the system in FIG. 2 in normal mode, when an input reference clock is available, in accordance with some embodiments of the present invention.
Figure 4:
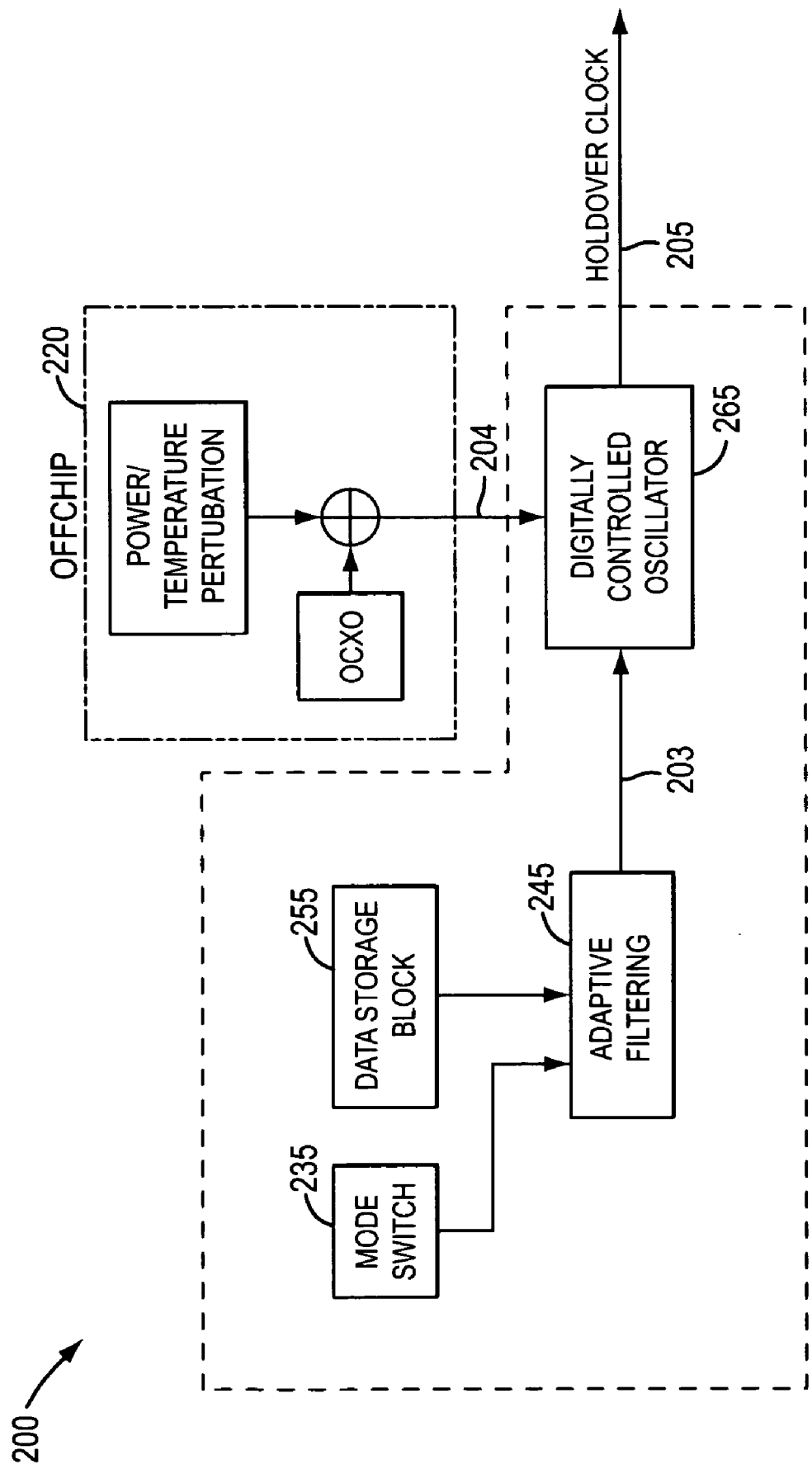
FIG. 4 shows a schematic diagram illustrating the operation of the system in FIG. 2 in holdover mode, when an input reference clock is unavailable, in accordance with some embodiments of the present invention.

System 200 operates in two modes, which are controlled by switch 235. When input reference clock signal 201 is available, switch 235 is in position "1" and system 200 operates in normal mode. PFD 225, AF 245, DCO 265, and FD 295 form a closed feedback loop, which generates a holdover clock signal that tracks the input reference clock signal. Operation of system 200 in normal mode is illustrated in FIG. 3 and explained in detail below. When input reference clock signal 201 is unavailable, switch 235 is in position "2" and system 200 operates in holdover mode. AF 295 and DCO 265 operate in an open loop and the output signal from DCO 265 is directly used as the output holdover clock signal for system 200. Operation of system 200 in holdover mode is illustrated in FIG. 4 and explained in detail below. When input reference clock signal is reestablished after it becomes unavailable, system 200 will switch back to normal mode.

Figure 5:
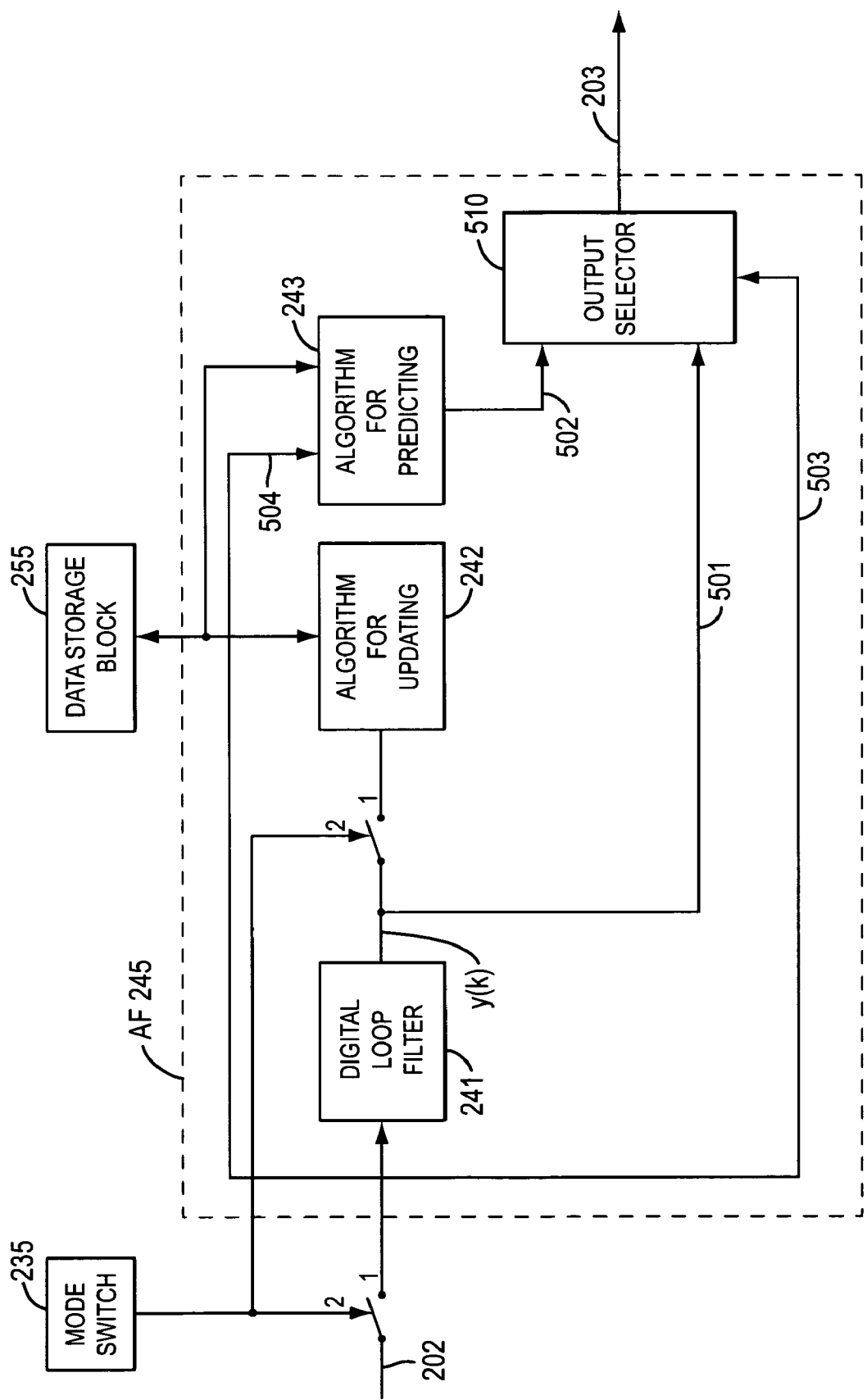
FIG. 5 shows a schematic diagram illustrating the operation of adaptive filtering module in the system illustrated in FIGS. 2, 3, and 4 in accordance with some embodiments of the present invention.
Figure 6:
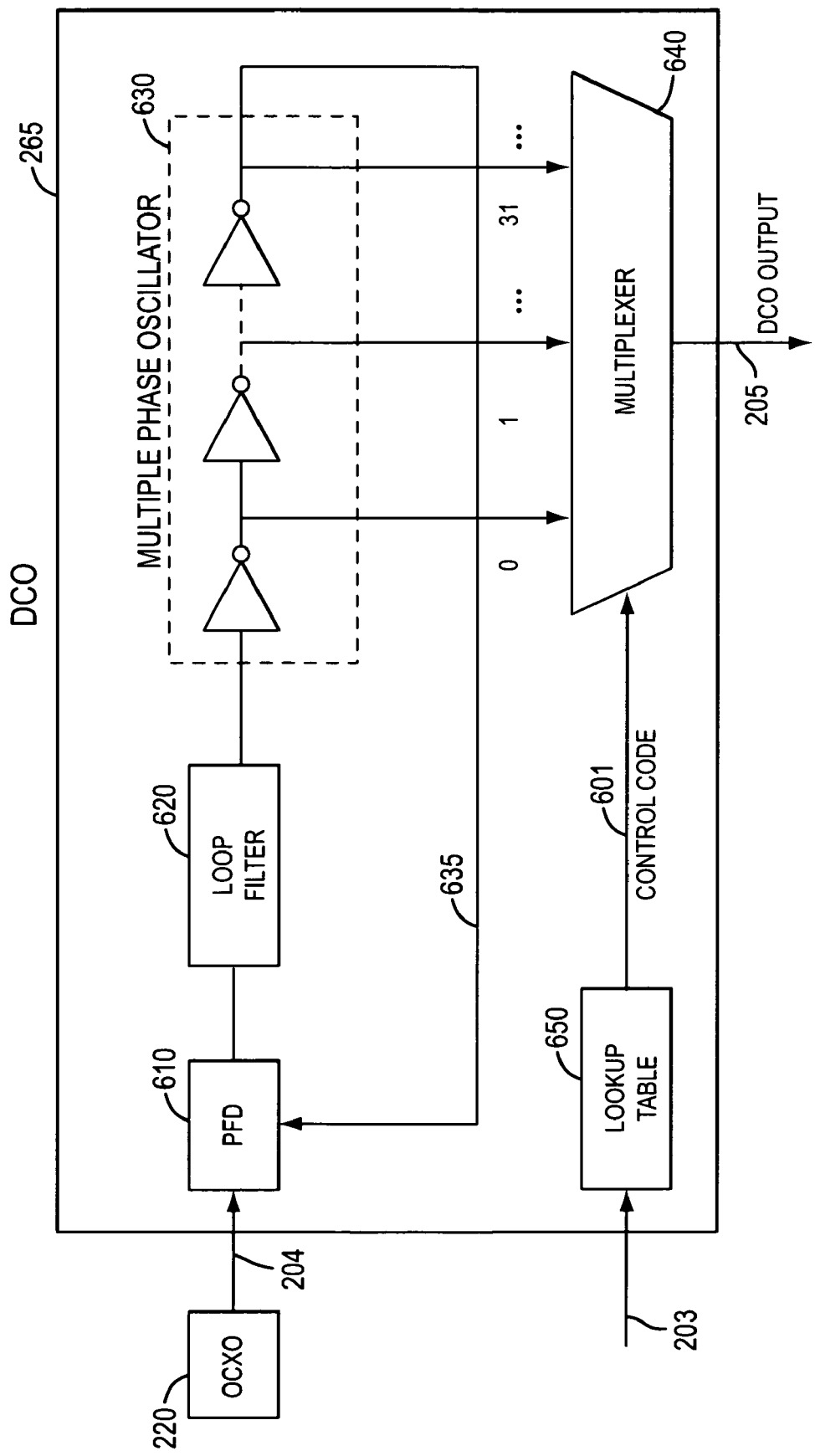
FIG. 6 shows a schematic diagram illustrating the operation of digitally controlled oscillator in the system illustrated in FIGS. 2, 3, and 4 in accordance with some embodiments of the present invention.

FIG. 3 illustrates a schematic diagram illustrating operation of system 200 in normal mode, when input reference clock 201 is available, in accordance with the present invention. PFD 225 receives input reference clock signal 201 and feedback clock signal 206, compares the phase difference between signals 201 and 206, and generates an error signal 202 representing the phase difference. AF 245 filters error signal 202, updates model parameters stored in data storage block 255, and outputs data signal 203, which represents the filtered error signal 202. Operation of AF 245 is illustrated in FIG. 5 and explained in detail below. DCO 265 operates with OCXO 220 as reference clock and adjusts the phase of clock signal 205 based on data signal 203. The operation of DCO 265 is illustrated in FIG. 6 and explained in detail below. FD 295 divides the frequency of clock signal 205 to generate feedback signal 206. Once feedback signal 206 is phase aligned with reference clock signal 201 clock signal 205 may be used as an output clock signal of integrated circuit 210 to synchronize events in a communication network.

FIG. 4 illustrates a schematic diagram of the operation of system 200 in holdover mode when input reference clock 201 is unavailable, in accordance with some embodiments of the present invention. Data Storage Means 255, AF 245, and DCO 265 operate in an open loop with OCXO 220 utilized as reference clock to DCO 265. Since error signal 202 is disconnected from AF 245 in the holdover mode, AF 245 no longer performs the filtering function and stops updating the model parameters stored in data storage block 255. Instead, AF 245 starts making predictions of frequency variations of clock signal 204 by reading model parameters stored in data storage block 255. Again, operation of AF 245 is illustrated in FIG. 5 and explained in detail below. Finally, DCO 265 generates holdover clock signal 205 by adjusting the phase of clock signal 204 based on data signal 203 from AF 245. This function of DCO 265 is also illustrated in FIG. 6 and explained in detail below.

FIG. 5 shows a schematic diagram illustrating the operation of adaptive filtering module 245 in the system illustrated in FIGS. 2, 3, and 4, in accordance with some embodiments of the present invention. AF 245 includes Digital Loop Filter ("DLF") 241, which filters error signal 202; Algorithm for Updating 242, which executes programs for updating model parameters; Algorithm for Predicting 243, which executes programs for predicting frequency variations; and output selector 510, which selects one of two signals to output as data signal 203. Switch 235 controls whether Algorithm for Updating 242 or Algorithm for Predicting 243 is active in AF 245, and is also used as selector signal 503 for Multiplexer 510. When system 200 operates in normal mode, switch 235 is in position "1" and an identical switch placed between DLF 241 and Algorithm For Updating 242 is also in position "1"; therefore, Algorithm For Updating 242 is active and updates model parameters stored in data storage block 255. When system 200 operates in holdover mode, switch 235 is in position "2" causing the identical switch to be in position "2" as well; therefore, Algorithm For Updating 242 stops updating and control signal 504 activates Algorithm For Predicting 243 to start-predicting.

In some embodiments of the invention, DLF 241 filters error signal 202 utilizing transfer function H(z), defined as $$H(z) = \frac{b_0 + b_1 z^{-1}}{1 + a_1 z^{-1} + a_2 z^{-2}}.$$

Coefficients $b_0$, $b_1$, $a_1$, and $a_2$ are selected by the loop bandwidth specifications.

The two separate sets of model parameters updated and stored in data storage block 255 indicate frequency variations due to aging effects and temperature perturbation of OCXO 220. The function g(k) is used to denote model parameters based on aging effects, t(k) is used to denote model parameters based on temperature perturbation, and y(k) is used to denote output of DLP 241, where k stands for a discrete time interval. In some embodiments of the invention, Algorithm For Updating 242 utilizes the following equations to update the model parameters:

$$g(k+1)=g(k)+\Delta \cdot y(k),$$

$$t(k+1)=t(k)+\Delta \cdot y(k),$$

where $\Delta$ is a loop parameter that controls the rate at which the parameters are updated to compensate for frequency variations due to aging effects and temperature perturbation of OCXO 220. The larger the $\Delta$ value, the faster each parameter converges to a final value, but with a larger error. Therefore, a tradeoff must be made between speed and accuracy.

In some embodiments of the invention, Algorithm For Predicting 243 predicts frequency variations of clock signal 204 from OCXO 220 based on the two sets of model parameters stored in data storage block 255 utilizing the equation F(k+1)=F(k)+G·k+T·k, where G and T denote the final values of the model parameters in the normal mode (G=g($k_1$) and T=t($k_1$)) where $k_1$ is the time period when input reference clock signal 201 becomes unavailable). Algorithm For Predicting 243 then outputs signal 502 which represents the predicted frequency variations F(k).

All the above equations utilized by Algorithm For Updating 242 and Algorithm for Predicting 243 are valid for a first-order model of OCXO 220. Higher order models can also be used for higher compensation precision, but at the expense of increased complexity in computation.

In some embodiments of the invention, Algorithm for Updating 242 and Algorithm for Predicting 243 are realized by software running on an embedded microprocessor. In another embodiment of the invention, Algorithm for Updating 242 and Algorithm for Predicting 243 are realized by Hardware Description Language and synthesized into a gate level netlist.

Output selector 510 is controlled by selector signal 503. In some embodiments of the invention, output selector 510 is realized by a multiplexer. When switch 235 is in position "1" (normal mode), selector signal 503 selects DLP output signal 501 as data signal 203 to send to DCO 265. When switch 235 is in position "2" (holdover mode), selector signal 503 selects Prediction signal 502 as data signal 203 to send to DCO 265.

FIG. 6 shows a schematic diagram illustrating the operation of DCO 265 in the system in FIGS. 2, 3, and 4, in accordance with some embodiments of the present invention. DCO 265 includes a PFD 610, a Loop Filter 620, a Multiple Phase Oscillator ("MPO") 630, a Multiplexer 640, and a Lookup Table 650. In some embodiments of the invention, MPO 630 is a 32-stage CMOS ring oscillator. PFD 610, LF 620, and MPO 630 form a phase locked loop which locks the frequency and phase of signal 635 from MPO 630. MPO 630 generates multiple clock signals that are evenly phase spaced. Multiplexer 640 receives these evenly phase spaced clock signals and selects one with the desired phase to output as clock signal 205 based on control code 601. Control code 601 is generated by converting data signal 203 based on values stored in Lookup Table 650. The phase of clock signal 205 represents adjustments made to compensate for frequency variations caused by OCXO 220.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system for generating a highly stable output clock signal, the system comprising:
an oven controlled crystal oscillator that generates a clock signal,
a receiver that generates an input reference clock signal,
a phase and frequency detector that generates an error signal based on a phase difference between the input reference clock signal and a feedback clock signal;
a data storage block that stores model parameters to predict frequency variations of the clock signal generated by the oven controlled crystal oscillator,
an adaptive filtering module comprising a digital loop filter that receives the error signal and produces a filter data signal, a first defined algorithm for updating the model parameters stored in the data storage block based on the first data signal, a second defined algorithm for predicting frequency variations of the clock signal generated by the oven controlled crystal oscillator based on values of the model parameters stored in the data storage block and providing a prediction data signal, and an output selector for generating an output data signal chosen between the filter data signal and the prediction data signal,
a switch that enables the system to operate either in normal mode by connecting the error signal to the adaptive filtering module and causing the output selector to choose the filter data signal when the input reference clock signal is available, or enables the system to operate in holdover mode by breaking the connection of the error signal to the adaptive filtering module and causing the output selector to choose the predicted data signal when the input reference clock signal is unavailable,
a digitally controlled oscillator that receives the clock signal from the oven controlled crystal oscillator, generates an output clock signal based on the clock signal, and adjusts a frequency of the output clock signal by adjusting a phase of the output clock signal according to the data signal from the adaptive filtering module, and
a feedback divider that divides the frequency of the output clock signal from the digitally controlled oscillator to generate the feedback clock signal when the system operates in the normal mode.

2. The system of claim 1, wherein the output selector in the adaptive filtering module comprises a multiplexer.

3. The system of claim 1, wherein the model parameters stored in the data storage block indicating the frequency variations include two sets, one due to temperature perturbation and the other due to aging effects of the oven controlled crystal oscillator.

4. The system of claim 1, when the system operates in normal mode, the adaptive filtering module receives the error signal from the phase and frequency detector, wherein the digital loop filter is used to filter the error signal and the first defined algorithm is utilized to update the two sets of model parameters, and the adaptive filtering module outputs a data signal representing the filtered error signal.

5. The system of claim 1, wherein the receiver is a Global Positioning System receiver which generates a GPS based frequency signal.

6. The system of claim 1, wherein the data, storage block comprises an Electrically Erasable Programmable Read-Only Memory.

7. The system of claim 1, wherein the first and second defined algorithms are realized by software running on an embedded microprocessor.

8. The system of claim 1, wherein the first and second defined algorithms are realized by Hardware Description Language and synthesized into a gate level netlist.

9. A method for generating an output clock signal comprising:
   determining whether a reference clock signal is present;
   when the reference clock signal is present,
      generating an error signal representing a phase difference between the input reference
      clock signal and a feedback clock signal,
      filtering the error signal using a digital loop filter,
      outputting a filtered error signal as a data signal,
      generating model parameters to predict frequency variations of a input clock signal, and
      storing the model parameters in a data storage block;
   when the reference clock signal is not represent,
      generating an prediction signal using the model parameters stored in the data storage block, and
      outputting the prediction signal as the data signal; and
   generating the output clock signal by adjusting the frequency of the input clock signal according to the data signal.

* * * * *